(12) United States Patent
Dour

(10) Patent No.: US 6,563,337 B2
(45) Date of Patent: May 13, 2003

(54) DRIVER IMPEDANCE CONTROL MECHANISM

(75) Inventor: Navneet Dour, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,731

(22) Filed: Jun. 28, 2001

(65) Prior Publication Data

US 2003/0001611 A1 Jan. 2, 2003

(51) Int. Cl.[7] .............................................. H03K 17/16
(52) U.S. Cl. ............................ 326/30; 326/31; 326/32; 326/87
(58) Field of Search ............................. 326/30, 31, 32, 326/86, 87

(56) References Cited

U.S. PATENT DOCUMENTS 5,134,311 A * 7/1992 Biber et al. ................. 307/270
5,838,177 A * 11/1998 Keeth ......................... 327/108
6,300,806 B1 * 10/2001 Theus et al. ................. 327/112
6,380,758 B1 * 4/2002 Hsu et al. ...................... 326/30

* cited by examiner

Primary Examiner—Michael Tokar
Assistant Examiner—Anh Q. Tran
(74) Attorney, Agent, or Firm—Blakely, Sokoloff, Taylor & Zafman LLP

(57) ABSTRACT

In one embodiment, a driver impedance control mechanism is adapted for a circuit board. The driver impedance control mechanism comprises (i) an integrated circuit including at least one driver circuit operating as a pull-up driver and a pull-down driver, (ii) a link coupled to an interface pin of the integrated circuit, the interface pin receiving signals from the at least one driver circuit, and (iii) a single resistive element terminating the link and separately compensating the at least one driver when operating as the pull-up driver and the pull-down driver and supplying the same impedance control bits to all driver to have good signal quality over the interface.

25 Claims, 3 Drawing Sheets

DRIVER IMPEDANCE CONTROL MECHANISM

1. Field

This invention relates to circuitry for compensation of both pull-up and pull-down drivers using a single external precision resistive element and reduced interface pin count.

2. General Background

For many years, impedance controlled drivers have been implemented on circuit boards. Especially for high-speed, input/output (I/O) product design, it is important that the impedance is generally fixed over variations in process, voltage and temperature. By maintaining a generally fixed impedance, a controlled driver can maintain good signal quality between devices on the circuit board and can maintain appropriate Direct Current (DC) voltage levels and alternating current (AC) timings margins.

Commonly depending on p-channel metal-on-semiconductor (PMOS) devices, pull-up characteristics for impedance controlled drivers are independently compensated from pull-down characteristics of impedance controlled drivers, which commonly depend on n-channel metal-on-semiconductor (NMOS) devices. In many cases, for example, mechanisms are employed on a circuit board where a pull-up driver is compensated against a precision resistor terminated to ground (GND) and a corresponding pull-down driver is compensated against the pull-up driver.

One disadvantage associated with this conventional impedance control mechanism is that it is quite inaccurate because the first driver gets compensated against a precision resistor while the second driver is compensated against a non-precision resistor. Granularity of the impedance controlled driver, on-die voltage supply variations or on-die transistor channel length and width variations can erroneously set the impedance of the second driver to an inaccurate value. Of course, this inaccuracy may be avoided if the interface uses two pins and two external precision resistors for compensating the pull-up and pull-down drivers separately. However, an extra interface pin would be necessary, and thus, adversely affects interface pin minimization.

BRIEF DESCRIPTION OF THE DRAWINGS

The features and advantages of the present invention will become apparent from the following detailed description of the present invention in which.

DESCRIPTION

The invention relates to a driver impedance control mechanism and method for compensating a driver circuit coupled to a terminated interface. More specifically, in one embodiment, the compensating driver circuit is an impedance-controlled driver coupled to a single resistive element held at an intermediate voltage level through a single interface pin and the same impedance control bits are sent to other drivers of the interface to keep good signal quality across the interface. The impedance-controlled driver can get compensated either as a pull-up driver or as a pull-down driver against external resistor.

Herein, terminology is used to discuss certain features of the invention. For example, a "platform" may generally be considered as hardware equipment and/or software that process information. Some illustrative examples of a platform include a computer (e.g., desktop, a laptop, a handheld, a server, a workstation, etc.), communication device (e.g., router, bridge, brouter, portable telephone, pager, etc.), a television set-top box and the like. A "resistive element" is generally considered herein as a resistor, potentiometer and the like. An "interface pin" is simply an input and/or output path, irregardless of its physical construction. A "link" is broadly defined as one or more information-carrying mediums to establish a communication pathway, including physical medium (e.g., electrical wire, optical fiber, cable, bus traces, etc.) or wireless medium (e.g., air in combination with wireless signaling technology).

In the following description, for purposes of explanation, numerous details are set forth in order to provide a thorough understanding of the invention. However, it will be apparent to one skilled in the art that these specific details are not required in order to practice an embodiment of the invention. In other instances, well-known electrical structures and circuits are shown in block diagram form in order not to obscure the invention.

Figure 1:
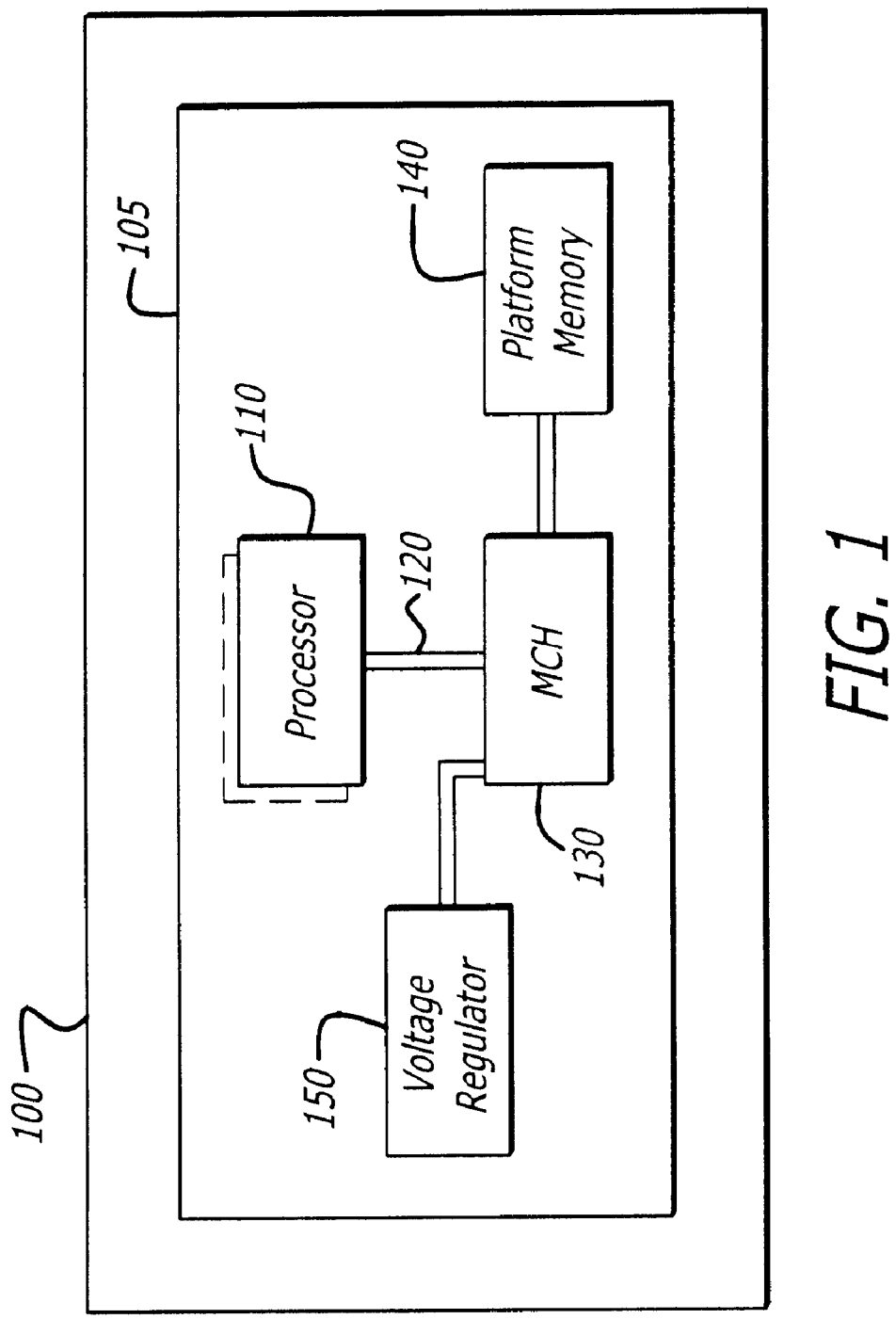
FIG. 1 is an exemplary embodiment of a platform in which one embodiment of the invention can be practiced.

Referring to FIG. 1, an exemplary diagram illustrating a platform 100 in which one embodiment of the invention can be practiced is shown. The platform 100 includes a circuit board 105 that supports one or more of the following devices: a processor 110, a memory controller hub (MCH) 130, a platform memory 140 and a voltage regulator 150. The voltage regulator 150 supplies power to devices on the circuit board 105 including a driver supply voltage ($V_{dd}$) to the MCH 130.

The processor 110 is generally considered as any hardware and/or software that performs operations on incoming data. For example, in this embodiment, the processor 110 represents a central processing unit of any type of architecture, such as complex instruction set computers (CISC), reduced instruction set computers (RISC), very long instruction word (VLIW), or hybrid architecture. The processor 110 may be compatible with an Intel Architecture (IA) processor such as the PENTIUM™ series, IA-32™ or an IA-64™ processor. It is contemplated, however, that other embodiments for the processor 110 may include a controller, a digital signal processor (DSP), a state machine and the like. Moreover, one or more processors 110 may be utilized as represented by dashed lines.

The processor(s) 110 is coupled to a host bus 120, which provides interface signals to allow the processor(s) 110 to communicate with other processors or devices. One of these devices may include the MCH 130, which is integrated into a chipset. The MCH 130 provides control and configuration of memory and I/O devices such as the platform memory 140 that stores code and data. In this embodiment, the MCH 130 includes an integrated circuit featuring an impedance controlled driver coupled to both the voltage regulator 150 for receipt of the supply driver voltage ($V_{dd}$) and a resistive element on the circuit board 105 as shown in FIG. 2.

Figure 2:
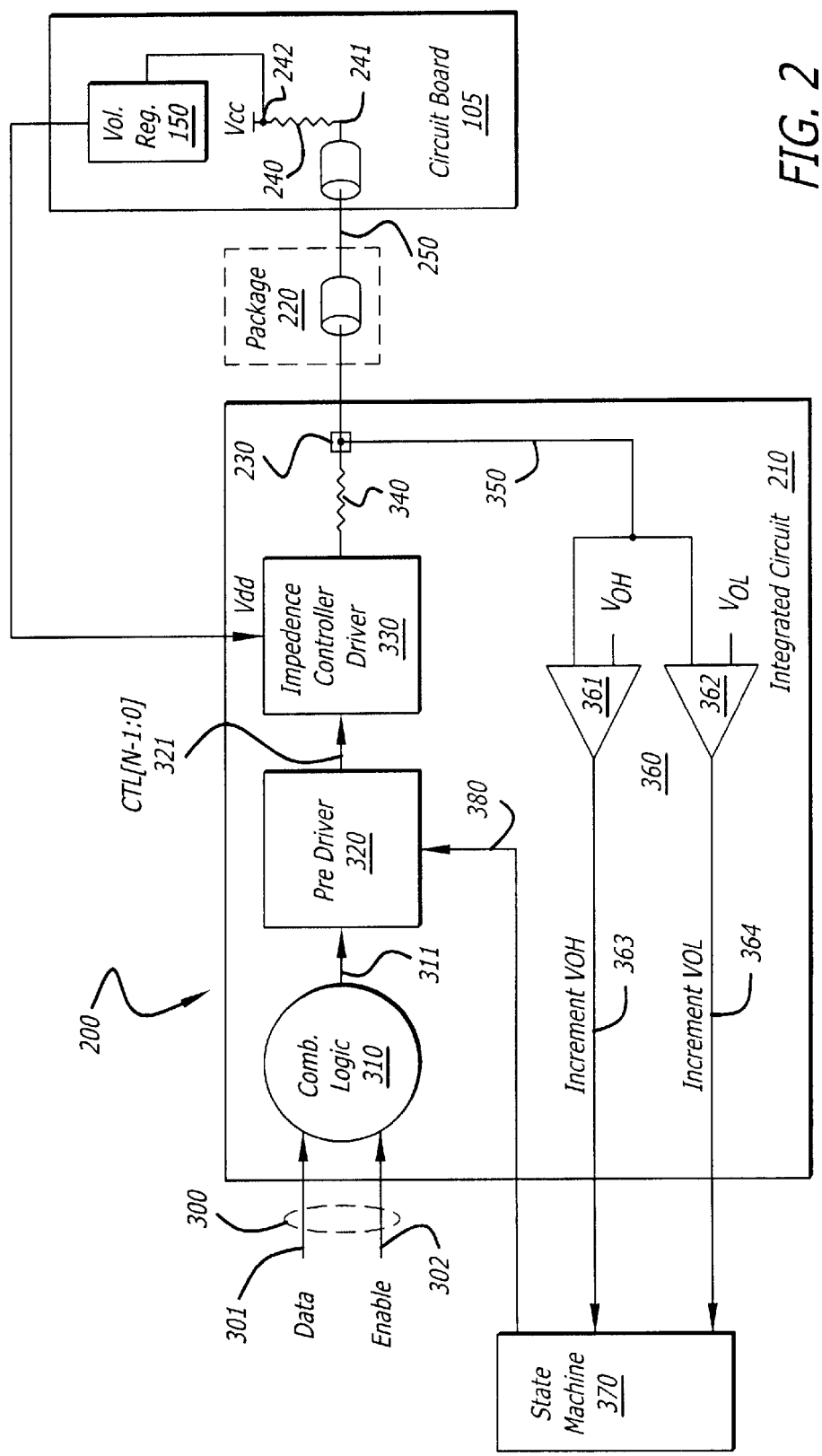
FIG. 2 is an exemplary embodiment of a driver impedance control mechanism implemented on an integrated circuit.

Referring now to FIG. 2, an exemplary embodiment of a driver impedance control mechanism 200 implemented on an integrated circuit 210 is shown. The driver impedance control mechanism 200 undergoes first, a pull-up compensation adjustment scheme to adjust the strength of the impedance-controlled driver operating as a pull-up driver. Later, the driver impedance control mechanism 200 undergoes a pull-down compensation adjustment scheme to adjust the strength of the impedance-controlled driver operating as a pull-down driver.

For illustrative purposes, the integrated circuit 210 may be implemented as part of the MCH 130 of FIG. 2, although the invention does not require such implementation. If implemented with an integrated circuit package 220, the integrated circuit 210 may experience small, additional impedance over a link 250. The link 250 is coupled between a resistance compensation pad 230 of the integrated circuit 210 and terminated by a resistive element 240 on the circuit board 105. One end 241 of the resistive element 240 is coupled to the link 250 while the other end 242 is coupled to the voltage regulator 150 for receipt of an intermediate voltage ($V_{tt}$), which may be approximately one-half the supply driver voltage ($V_{dd}$).

Herein, the driver impedance control mechanism 200 comprises a control interface 300, combinatorial logic 310, a pre-driver circuit 320, an impedance controlled driver 330, a bump resistive element 340, a sense link 350 coupled to the resistance compensation pad 230, a plurality of differential amplifier elements 360. The output of the differential amplifier elements 360 is provided to a state machine 370. The state machine 370 provides one or more feedback signals over link 380 to the pre-driver circuit 320 in efforts to further control impedance adjustment for the impedance controlled driver 330 or to maintain its current impedance value. These feedback signals are impedance control bits, which are used to set the pre-driver circuit 320 as well as other drivers of an interface (e.g., an interface for the MCH 130 of FIG. 1) to maintain good signal quality across that interface.

As shown, the control interface 300 includes at least one data link 301 and an enable link 302. The enable link 302, when placed in an active state, places the driver impedance control mechanism 200 into an operational state. In particular, when the enable link 302 is active, the combinatorial logic 310 provides an input signal 311 to the pre-driver circuit 320 that indicates whether the impedance-controlled driver 330 is to operate as a pull-up driver or a pull-down driver. For one embodiment, if the data link 301 is inactive (e.g., placed in a logical LOW state), the impedance-controlled driver 330 is to operate as a pull-down driver. If the data link 301 is active (e.g., placed in a logical HIGH state), the impedance controlled driver 330 is to operate as a pull-up driver. Thus, the type of driver is dependent on the state of the data link 301. However, when the enable line 302 is placed in an inactive state, the input signal 311 is tri-stated so that the driver impedance control mechanism 200 is non-operational.

The pre-driver circuit 320 receives the input signal 311 to indicate when the driver impedance control mechanism is operational and receives feedback signal(s) over link 380. In response, the pre-driver circuit 320 outputs a control signal CTL[N-1:0] 321 that selects the amount of impedance driven by impedance controlled driver 330. For one embodiment, although not shown, the amount of impedance may be separated into N transistor groupings selected by the pre-driver circuit 320. Each grouping may have up to $2^{N-1}$ transistors in which the lesser number of transistors results in a smaller affect on impedance. For instance, one grouping may have one transistor (e.g., a P-channel transistor), a second grouping may have two transistors, and a third grouping may have four transistors resulting in bigger impact on impedance than the first two groupings. Thus, for one embodiment, the pre-driver circuit 320 may select one or more of these grouping for adjustment of the impedance value for the impedance controlled driver.

The impedance-controlled driver 330 may drive a voltage sensed at the resistance compensation pad 230 via link 350 and the sensed voltage is compared against two threshold voltages by the plurality of differential amplifier elements 360. These threshold voltages include a threshold voltage for pull-up compensation ($V_{OH}$) and a threshold voltage for pull-down compensation ($V_{OL}$). These voltages $V_{OH}$ and $V_{OL}$ are determined by the target impedance required for the impedance controlled driver 330 to operate at a particular level of pull-up driver and a pull-down driver, respectively. While voltages $V_{OH}$ and $V_{OL}$ are provided from an outside source for better accuracy and control, it is contemplated that these voltages can be provided on-chip through a resistive network.

During a pull-up compensation adjustment scheme, the state machine 370 starts with very strong pull-up strength (e.g., small pull-up impedance), in the event that the sensed voltage is greater than $V_{OH}$, normally greater than $V_{tt}$, a first differential amplifier element 361 outputs an active INCREMENTVOH signal over link 363 to the state machine 370. The active INCREMENTVOH signal notifies the state machine 370 to increase the impedance driven by the impedance controlled driver 330. In response, the state machine 370 outputs the feedback signal(s). In one embodiment, the feedback signal(s) turn off various transistors for increasing the impedance being driven. Once the sensed voltage is determined to be approximately equal to $V_{OH}$, the first differential amplifier element 361 deactivates the INCREMENTVOH signal to indicate to the state machine 370 that the targeted pull-up driver strength has been met.

Besides performance of a pull-up compensation adjustment scheme, the driver impedance control mechanism 200 further performs the pull-down compensation adjustment scheme by initially providing the lowest impedance for pull-down.

In the event that the sensed voltage at the resistance compensation pad 230 is less than $V_{OL}$, normally less than $V_{tt}$, a second differential amplifier element 362 outputs an active INCREMENTVOL signal over link 364 to the state machine 370. The active INCREMENTVOL signal notifies the state machine 370 to increase the impedance driven by the impedance controlled driver 330. In response, the state machine 370 outputs the feedback signal(s) over link 380. In one embodiment, the feedback signal(s) 381 turns off various transistors for increasing the impedance being driven. Once the sensed voltage is determined to be approximately equal to $V_{OL}$, the second differential amplifier element 362 deactivates the INCREMENTVOL signal to indicate to the state machine 370 that the targeted pull-down driver strength has been met.

As a result, compensation for both pull-up and pull-down drivers can be accomplished with a single resistive element 240 and a single interface pin by terminating the resistance compensation pad to an intermediate voltage ($V_{tt}$).

Figure 3:
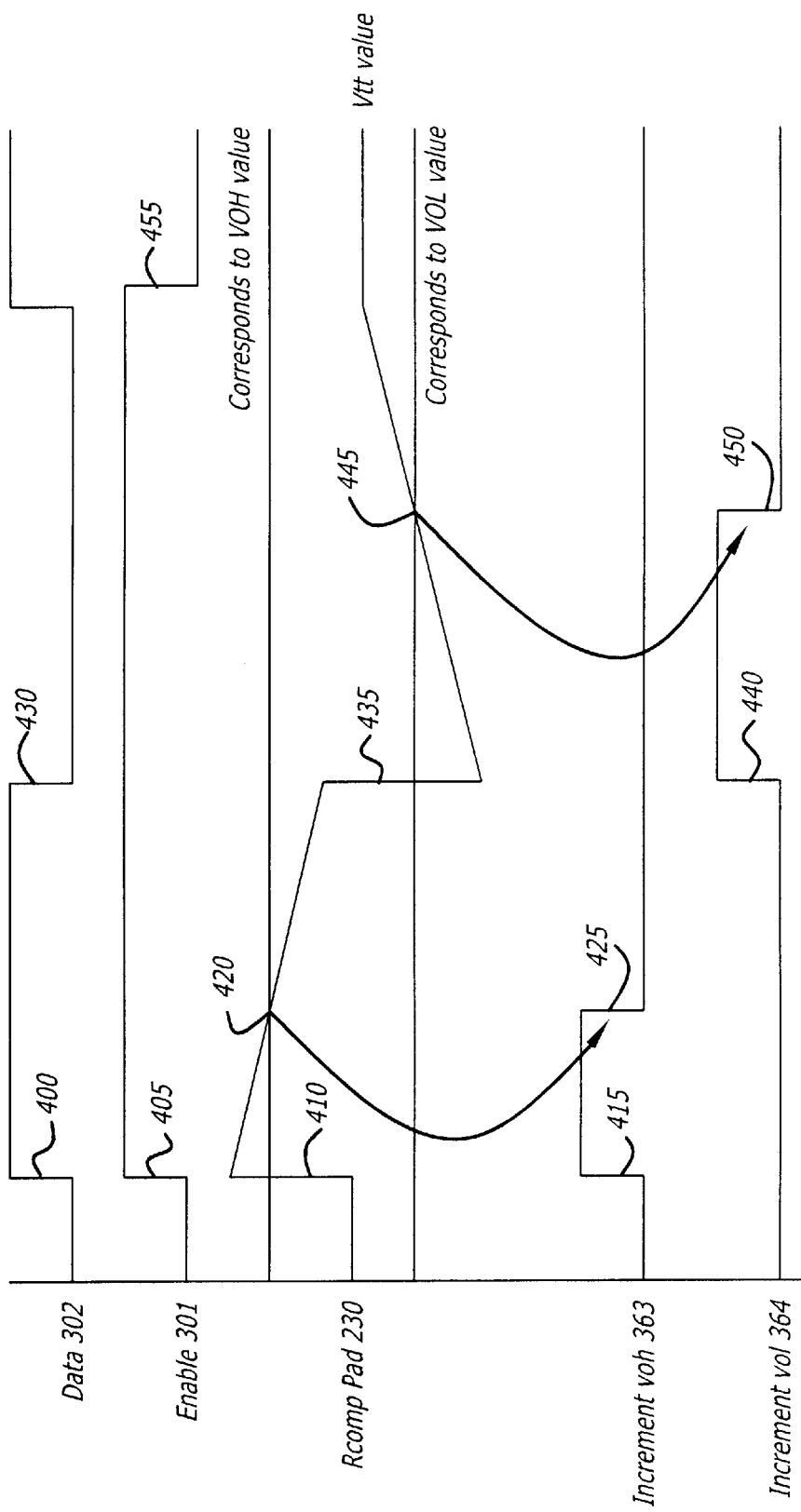
FIG. 3 is an exemplary embodiment of a timing diagram of signals utilized by the driver impedance control mechanism of FIG. 2.

Referring now to FIG. 3, an exemplary embodiment of a timing diagram of signals utilized by the driver impedance control mechanism of FIG. 2 is shown. Initially, upon activation of the enable link 302 and the data link 301, which signals a pull-up compensation adjustment scheme for this embodiment, compensation is performed so that the voltage driven on the resistance compensation pad is substantially higher than $V_{OH}$ (see labels 400, 405, 410). As a result, the INCREMENTVOH signal is activated to cause an increase in impedance and reduction of pull-up drive strength until the voltage driven on the resistance compensation pad is approximately equal to $V_{OH}$ (labels 415 and 420). Thereafter, the INCREMENTVOH signal is deactivated to set the targeted pull-up impedance (label 425).

Upon deactivation of the data link 301, which signals a pull-down compensation adjustment scheme for this embodiment, compensation is performed so that the voltage driven on the resistance compensation pad is substantially lower than $V_{OL}$ (see labels 430 and 435). As a result, the INCREMENTVOL signal is activated to cause an increase in impedance and reduction of pull-down drive strength until the voltage driven on the resistance compensation pad is approximately equal to $V_{OL}$ (labels 440 and 445). Thereafter, the INCREMENTVOL signal is deactivated to set the targeted pull-down impedance (label 450). Also, the enable link 302 is deactivated to denote completion of the compensation adjustments (label 455).

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A circuit comprising:

a link;

at least one driver circuit coupled to the link, the at least one driver circuit operating as a pull-up driver and a pull-down driver;

a resistance compensation pad coupling the link to the at least one driver circuit, the resistance compensation pad is further coupled to a plurality of differential amplifier elements via a sense link; and a resistive element terminating the link and separately compensating the at least one driver circuit when operating as the pull-up driver and the pull-down driver.

2. The circuit of claim 1, wherein the at least one driver circuit is an impedance controlled driver.

3. The circuit of claim 1, wherein a first differential amplifier element of the plurality of differential amplifier elements receives as input (i) a voltage sensed at the resistance compensation pad and (ii) a threshold voltage for pull-up compensation.

4. The circuit of claim 3, wherein a second differential amplifier element of the plurality of differential amplifier elements receives as input (i) the voltage sensed at the resistance compensation pad and (ii) a threshold voltage for pull-down compensation.

5. The circuit of claim 3, wherein an output of the first differential amplifier element is coupled to a state machine adapted to adjust an impedance driven by the at least one driver circuit.

6. The circuit of claim 5, wherein the output of the first differential amplifier element is activated if the voltage sensed at the resistance compensation pad is greater than the threshold voltage for pull-up compensation, the activated output signal causes the state machine to increase the impedance driven by the at least one driver circuit.

7. The circuit of claim 4, wherein an output of the second differential amplifier element is coupled to a state machine adapted to adjust an impedance driven by the at least one driver circuit.

8. The circuit of claim 7, wherein the output of the second differential amplifier element is activated if the voltage sensed at the resistance compensation pad is less than the threshold voltage for pull-down compensation, the activated output signal causes the state machine to increase the impedance driven by the at least one driver circuit.

9. The circuit of claim 4, wherein the at least one driver circuit is a pull-up driver circuit and a pull-down driver circuit coupled to the same resistive element.

10. Adapted for connection on a circuit board, a driver impedance control mechanism comprising:

an integrated circuit including at least one driver circuit operating as a pull-up driver and a pull-down driver, the integrated circuit further comprises:

an interface pin to receive signals from the at least one driver circuit, a pad coupled to the interface pin, and a plurality of differential amplifier elements coupled to the pad via a sense link, a first differential amplifier element of the plurality of differential amplifier elements to receive as input a voltage sensed at the pad and a threshold voltage for pull-up compensation and a second differential amplifier element of the plurality of differential amplifier elements to receive as input the voltage sensed at the pad and a threshold voltage for pull-down compensation;

a link coupled to the interface pin of the integrated circuit; and a resistive element terminating the link and separately compensating the at least one driver when operating as the pull-up driver and the pull-down driver.

11. The driver impedance control mechanism of claim 10, wherein the at least one driver circuit is an impedance controlled driver.

12. The driver impedance control mechanism of claim 10, wherein an output of the first and second differential amplifier elements are coupled to a state machine adapted to decrease and increase an impedance driven by the at least one driver circuit, respectively.

13. The driver impedance control mechanism of claim 12, wherein feedback signals from the state machine are used by a plurality of other drivers besides the at least one driver circuit.

14. A method comprising providing an integrated circuit including at least one driver circuit operating as a pull-up driver and a pull-down driver, the at least one driver circuit being coupled to a pad that is connected to a resistive element over a link;

maintaining the resistive element at an intermediate voltage ($V_n$);

signaling a pull-up compensation adjustment scheme;

initially driving a voltage on the pad substantially higher than a threshold voltage for pull-up compensation;

adjusting an impedance driven by the at least one driver circuit by sensing a voltage at the pad of the integrated circuit and increasing the impedance until the voltage at the pad is approximately equal to the threshold voltage for pull-up compensation;

signaling a pull-down compensation adjustment scheme;

initially driving a voltage on the pad substantially lower than a threshold voltage for pull-down compensation; and adjusting the impedance driven by the at least one driver circuit by sensing the voltage at the pad of the integrated circuit and increasing the impedance until the voltage at the pad is approximately equal to the threshold voltage for pull-down compensation.

15. The method of claim 14, wherein the signaling of the pull-up compensation adjustment scheme includes activation of a data link and an enable link while the signaling of the pull-down compensation adjustment scheme includes deactivation of the data link and activation of the enable link.

16. The method of claim 15, wherein the signaling of the pull-down compensation adjustment scheme includes deactivation of a data link and activation of an enable link being inputs to the integrated circuit.

17. The method of claim 14, wherein the adjustment of the impedance driven by the at least one driver circuit through increasing of the impedance includes turning off selected transistors acting as the impedance driven by the at least one driver circuit.

18. The method of claim 14, wherein the adjustment of the impedance driven by the at least one driver circuit through decreasing of the impedance includes turning on selected transistors acting as the impedance driven by the at least one driver circuit.

19. A method comprising:

providing a driver circuit operating as a pull-up driver and a pull-down driver, the driver circuit being coupled to a pad of the integrated circuit that is connected to a resistive element over a link;

maintaining the resistive element at an intermediate voltage ($V_{tt}$); and adjusting an impedance driven by the driver circuit by sensing a voltage at the pad and increasing the impedance until the voltage at the pad is approximately equal to a threshold voltage for pull-up compensation.

20. The method of claim 19, further comprising:

adjusting the impedance driven by the driver circuit by sensing the voltage at the pad and increasing the impedance until the voltage at the pad is approximately equal to a threshold voltage for pull-down compensation.

21. The method of claim 19, wherein prior to adjusting the impedance driven by the driver circuit sensing the voltage at the pad and increasing the impedance until the voltage at the pad is approximately equal to the threshold voltage for pull-up compensation, the method further comprises:

signaling a pull-up compensation adjustment scheme; and initially driving the voltage on the pad substantially higher than the threshold voltage for pull-up compensation.

22. The method of claim 21, wherein prior to adjusting the impedance driven by the driver circuit sensing the voltage at the pad and increasing the impedance until the voltage at the pad is approximately equal to the threshold voltage for pull-down compensation, the method further comprises:

signaling a pull-down compensation adjustment scheme; and initially driving the voltage on the pad substantially lower than the threshold voltage for pull-down compensation.

23. The method of claim 22, wherein the signaling of the pull-up compensation adjustment scheme includes activation of a data link and an enable link while the signaling of the pull-down compensation adjustment scheme includes deactivation of the data link and activation of the enable link.

24. The method of claim 19, wherein the adjustment of the impedance driven by the driver circuit through increasing of the impedance includes turning off selected transistors acting as the impedance driven by the driver circuit.

25. The method of claim 19, wherein the adjustment of the impedance driven by the driver circuit through decreasing of the impedance includes turning on selected transistors acting as the impedance driven by the driver circuit.

* * * * *